(12) United States Patent
Lee et al.

(10) Patent No.: US 9,869,895 B2
(45) Date of Patent: Jan. 16, 2018

(54) COATING DEVICE, METHOD OF MANUFACTURING DISPLAY SUBSTRATE USING THE SAME AND DISPLAY SUBSTRATE MANUFACTURED USING THE SAME

(71) Applicant: Samsung Display Co., LTD., Yongin, Gyeonggi-Do (KR)

(72) Inventors: Seok-Ho Lee, Hwaseong-si (KR); Min-Sung Kim, Suwon-si (KR); Ki-Su Jin, Daegu (KR); Jung-Min Hong, Chungcheongbuk-do (KR)

(73) Assignee: Samsung Display Co., Ltd. (KR)

( * ) Notice: Subject to any disclaimer, the term of this patent is extended or adjusted under 35 U.S.C. 154(b) by 120 days.

(21) Appl. No.: 14/037,929

(22) Filed: Sep. 26, 2013

(65) Prior Publication Data

US 2014/0272322 A1    Sep. 18, 2014

(30) Foreign Application Priority Data

Mar. 12, 2013 (KR) .................. 10-2013-0026055

(51) Int. Cl.
| | | |
|---|---|---|
| *B05B 13/00* | (2006.01) | |
| *G02F 1/1335* | (2006.01) | |
| *G02F 1/13* | (2006.01) | |
| *H01L 21/67* | (2006.01) | |
| *H01L 21/683* | (2006.01) | |
| *B05B 15/04* | (2006.01) | |
| *B05B 13/04* | (2006.01) | |

(52) U.S. Cl.
CPC ...... *G02F 1/133512* (2013.01); *B05B 15/045* (2013.01); *B05B 15/0431* (2013.01); *G02F 1/1303* (2013.01); *H01L 21/6715* (2013.01); *H01L 21/6838* (2013.01); *B05B 13/0431* (2013.01); *Y10T 428/24777* (2015.01)

(58) Field of Classification Search
CPC ..................................... B05B 15/045
USPC ................. 118/301, 504, 505, 721
See application file for complete search history.

(56) References Cited

U.S. PATENT DOCUMENTS

| | | | | |
|---|---|---|---|---|
| 5,403,684 | A | * 4/1995 | Schroeder et al. | ............... 430/5 |
| 5,955,837 | A | 9/1999 | Horikx et al. | |
| 6,068,914 | A | 5/2000 | Boire et al. | |

(Continued)

FOREIGN PATENT DOCUMENTS

| | | |
|---|---|---|
| JP | 11-212480 | 8/1999 |
| KR | 1020110010250 A | 2/2011 |

(Continued)

*Primary Examiner* — Yewebdar Tadesse
(74) *Attorney, Agent, or Firm* — Innovation Counsel LLP

(57) ABSTRACT

A coating device includes an upper stage, a lower stage and a spraying part. The upper stage masks an upper surface of a display panel. The lower stage masks a lower surface of the display panel. The spraying part sprays ink to a side surface of the display panel. The side surface of the display panel is exposed between the upper stage and the lower stage. The coating device includes the upper stage and the lower stage, so that the coating device may form a coating layer of uniform thickness by precisely spraying ink. In addition, a cross-section of the coating layer may be precisely formed having specific shape such as an L or C shape. A display apparatus having high light usage efficiency and reduced light leakage may be provided by using the coating device.

20 Claims, 13 Drawing Sheets

(56) References Cited

U.S. PATENT DOCUMENTS

| | | | |
|---|---|---|---|
| 6,756,074 B2* | 6/2004 | Potyrailo et al. | 506/32 |
| 2004/0118506 A1* | 6/2004 | Dong | E04B 1/7662 |
| | | | 156/167 |
| 2008/0145540 A1* | 6/2008 | Houle et al. | 427/282 |
| 2014/0069332 A1* | 3/2014 | DeMott, III | B05B 15/04 |
| | | | 118/504 |

FOREIGN PATENT DOCUMENTS

| | | |
|---|---|---|
| KR | 1020120110555 A | 10/2012 |
| KR | 1020120130494 A | 12/2012 |

\* cited by examiner

COATING DEVICE, METHOD OF MANUFACTURING DISPLAY SUBSTRATE USING THE SAME AND DISPLAY SUBSTRATE MANUFACTURED USING THE SAME

This application claims priority to Korean Patent Application No. 10-2013-0026055, filed on Mar. 12, 2013, and all the benefits accruing therefrom under 35 U.S.C. §119, where the contents of said application are incorporated by reference herein in their entirety.

BACKGROUND

1. Field of Disclosure

The present disclosure of invention relates to a coating device, a method of manufacturing a display substrate using the coating device, and a display substrate manufactured using the coating device and the method of using the coating device.

More particularly, exemplary embodiments of the present invention relate to a coating device for manufacturing a liquid crystal display apparatus, a method of manufacturing a display substrate using the coating device, and the display substrate manufactured using the coating device.

2. Description of Related Technology

Recently, display devices having lighter weight and smaller size than conventional cathode ray tubes (CRT) display have gained favor in the display apparatus industry. In particular, the liquid display apparatus or "LCD" has been highly regarded due to its relatively small size, light weight and low-power-consumption as compared to that of other display technologies.

Generally, the liquid crystal display apparatus applies a voltage to a specific and optically significant molecular arrangement configured to change the molecular arrangement. The liquid crystal display apparatus displays an image using changes of an optical property (for example, birefringence, rotatory polarization, dichroism and light scattering) of a liquid crystal cell according to the changes of the molecular arrangement.

The liquid crystal display apparatus typically includes a backlight assembly, a light guiding plate and a display panel stacked one on the other in the recited order. During finishing of manufacture, a side surface (a.k.a. sidewall) of the display panel may be coated with an ink or other protective and/or coloring material for example in a manual manner by a worker's hand alone, or with aid of a paint-blocking tape. More specifically, the ink or other protective and/or coloring material may be added onto the side surface of the display panel so as to prevent undesired light leakage through the side surface where the light originates from the backlighting unit and is intended to be controllably projected through a top major surface of the display panel. Deviations in workmanship may occur due to the manual approach and may produce defective products having light leakage problems through a side boundary of the display panel.

It is to be understood that this background of the technology section is intended to provide useful background for understanding the here disclosed technology and as such, the technology background section may include ideas, concepts or recognitions that were not part of what was known or appreciated by those skilled in the pertinent art prior to corresponding invention dates of subject matter disclosed herein.

SUMMARY

A workpiece coating device is configured in accordance with the present disclosure to uniformly form a thin film on at least one sidewall of a supplied and predetermined workpiece by spraying a light blocking and/or light reflecting ink.

One or more exemplary embodiments of the disclosure provide a method of manufacturing a display substrate using the coating device.

One or more exemplary embodiments of the disclosure provide a display substrate manufactured using the coating device.

According to an exemplary embodiment, a coating device includes an upper stage, a lower stage and a spraying part. The upper stage masks an upper surface of a display panel. The lower stage masks a lower surface of the display panel. The spraying part sprays ink to a side surface of the display panel. The side surface of the display panel is exposed between the upper stage and the lower stage.

In an exemplary embodiment, the upper stage may include a lower surface having a shape substantially the same as an upper surface of the display panel. The lower stage may include an upper surface having a shape substantially the same as a lower surface of the display panel.

In an exemplary embodiment, the upper stage may further include an upper contacting portion disposed on a boundary of the lower surface of the upper stage. The upper contacting portion may contact to a boundary of the upper surface of the display panel.

In an exemplary embodiment, the lower stage may include a protrusion disposed on a boundary of the upper surface of the lower stage.

In an exemplary embodiment, a first groove may be formed on the protrusion. A plurality of air holes may be provided for forming a pushing out cushion or wall of pressurized air along the length of the first groove. The air holes may be connected to an air supplying part supplying air.

In an exemplary embodiment, a second groove may be formed on the protrusion. A plurality of vacuum holes for sucking air in the second groove may be formed in the second groove. The vacuum holes may be connected to vacuum generating part forming vacuum.

In an exemplary embodiment, the lower stage may further include a lower contacting portion disposed on the protrusion. The lower contacting portion may contact to a boundary of the lower surface of the display panel and may be elastic.

In an exemplary embodiment, the protrusion may be spaced apart from the side surface of the display panel by a first length toward inside of the display panel. A boundary of the lower surface of the display panel may be exposed.

In an exemplary embodiment, the coating device may further include an upper polarizer disposed on the display panel, and a lower polarizer disposed under the display panel. The lower polarizer may be smaller than the display panel in a plan view. A boundary of the lower surface of the display panel may be exposed. The protrusion may contact to the boundary of the lower surface of the display panel.

In an exemplary embodiment, the ink may have tolerance for not being dissolved by isopropyl alcohol.

In an exemplary embodiment, the nozzle of the spraying part may be spaced apart from the side surface of the display panel. The nozzle may be kept perpendicular to the side surface. The spraying part may be connected to a multi joint robot.

In an exemplary embodiment, the ink may be sprayed to form a coating layer having a thickness of about 1 μm to about 5 μm.

According to another exemplary embodiment, a display panel includes an upper surface, a lower surface opposite to the upper surface, and a side surface connecting the upper surface and the lower surface. A light blocking coating layer may be formed on the side surface by spaying ink.

In an exemplary embodiment, the light blocking coating layer may extend to cover a portion of the lower surface adjacent to the side surface. The cross-section of the light blocking coating layer may have an L shape.

In an exemplary embodiment, a portion of the light blocking coating layer covering the lower surface may be formed from the side surface to about 0.6 mm to about 1 mm from the side surface.

In an exemplary embodiment, the light blocking coating layer may extend to cover a portion of the lower surface adjacent to the side surface. The light blocking coating layer may extend to cover a portion of the upper surface adjacent to the side surface. The cross-section of the light blocking coating layer may have a C shape.

In an exemplary embodiment, a thickness of the light blocking coating layer may be about 1 µm to about 5 µm.

According to still another exemplary embodiment, a method of manufacturing a display panel includes aligning a display panel on a lower stage, fixing the display panel by contacting an upper stage on the display panel, and forming a coating layer on a side surface of the display panel by spraying ink, where the side surface is exposed when the display panel is sandwiched by the upper and lower stages.

In an exemplary embodiment, the ink may include pigment having light blocking function and a tolerance for isopropyl alcohol.

In an exemplary embodiment, thickness of the coating layer may be about 1 µm to about 5 µm.

According to the exemplary embodiments of the present disclosure, the coating device includes the upper stage and the lower stage, so that the coating device may form a coating layer by precisely spraying ink. In addition, a cross-section of the coating layer may be precisely formed having specific shape such as an L or C shape.

In addition, a display apparatus having high light efficiency and reducing light leakage may be provided by using the coating device.

BRIEF DESCRIPTION OF THE DRAWINGS

The above and other features of the present disclosure of invention will become more apparent by describing in detail exemplary embodiments thereof with reference to the accompanying drawings, in which.

DETAILED DESCRIPTION

Hereinafter, the present disclosure of invention will be provided in more detail with reference to the accompanying drawings.

Figure 1:
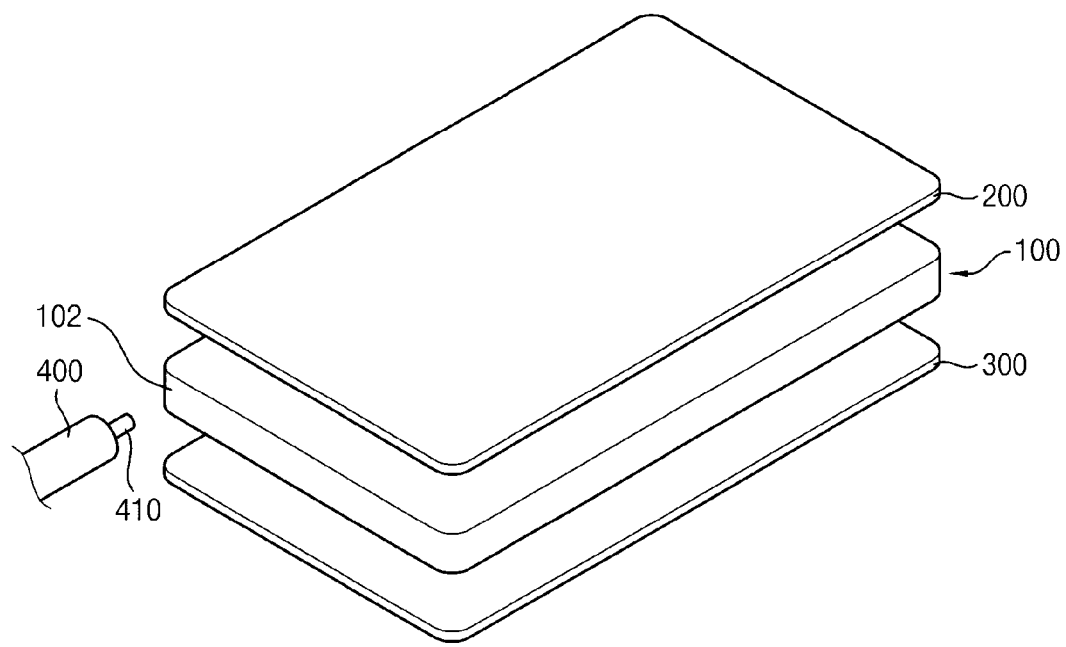
FIG. 1 is a perspective view briefly illustrating a coating device according to an exemplary embodiment of the present disclosure.

FIG. 1 is a perspective view briefly illustrating a coating device (or sidewall-coating work station) according to a first exemplary embodiment.

Referring to FIG. 1, the coating device (sidewall-coating work station) includes a lower stage 300 (a.k.a. lower masking plate), an upper stage 200 (a.k.a. upper masking plate) and a sidewall spraying part 400.

The upper stage 200 and the lower stage 300 are spaced apart and face each other. A display panel (or a display substrate if the workpiece is in a less-completed state) 100 which is a target for ink coating on its sidewalls is disposed between the upper stage 200 and the lower stage 300.

Each of the upper stage 200 and the lower stage 300 have a plane shape substantially the same as that of the corresponding major surface of the target display panel 100. (It is within the contemplation of the disclosure that if the target panel 100 has one or more nonplanar (e.g., curved) major surfaces, the mating ones of the masking stages 200, 300 will be similarly nonplanar in shape so as to provide the desired paint masking function.) A side surface (a.k.a. sidewall) 102 of the display panel 100 which is not covered by the upper stage 200 and the lower stage 300 is exposed. The spraying part 400 sprays ink to the side surface 102, so that a light blocking coating layer is formed on the side surface 102.

The upper stage 200 and the lower stage 300 may each consist of or include metal. The metal may be an electrically conductive one. For example, the upper stage 200 and the lower stage 300 may include aluminum or an aluminum alloy.

The spraying part 400 includes a nozzle 410 for spraying the ink. The spraying part 400 may be moved along and parallel to the side surface 102 of the display panel 100 by means of a robotic movement means (not shown), and the spraying part 400 is operated to uniformly spray the ink to the side surface 102 so that a light blocking coating layer may be uniformly formed on the side surface 102. The ink may be sprayed as spray type ink droplets.

The ink may be a pigment type ink including a shading agent configured to prevent light leakage of the display panel 100. For example, the ink may include a resin, a pigment or the like to have light blocking function and tolerance for isopropyl alcohol. In addition, the ink may preferably include a quick drying (e.g., highly volatile) solvent because the ink is coated by spray type. Thus, the ink may include proper solvent, so that the solvent may be dried in about 5 seconds after the ink is spayed at room temperature and normal atmosphere conditions.

More specifically and although not shown in figures, the spraying part 400 may be connected to a multi-joint robot, so that the position of the spraying part 400 may be adjusted depending on needs. The nozzle 410 of the spraying part 400 may preferably be spaced apart from the side surface 102 of the display panel 100 by a predetermined distance suited for the desired spraying profile. The nozzle 410 may preferably be perpendicular to the side surface 102 of the display panel 100.

Figure 2A:
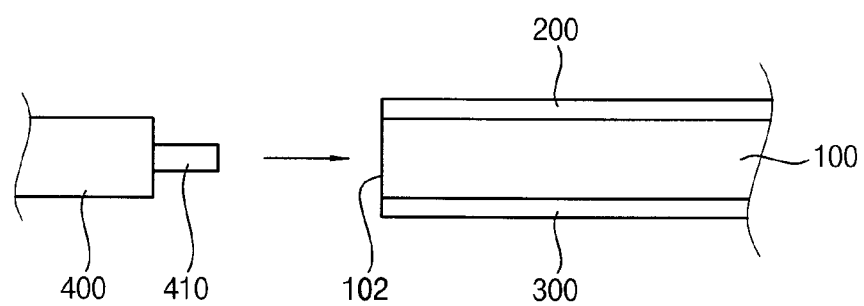
FIGS. 2A to 2B are cross-sectional views briefly illustrating a method of manufacturing a display panel or a display panel using the coating device of FIG. 1.
Figure 2B:
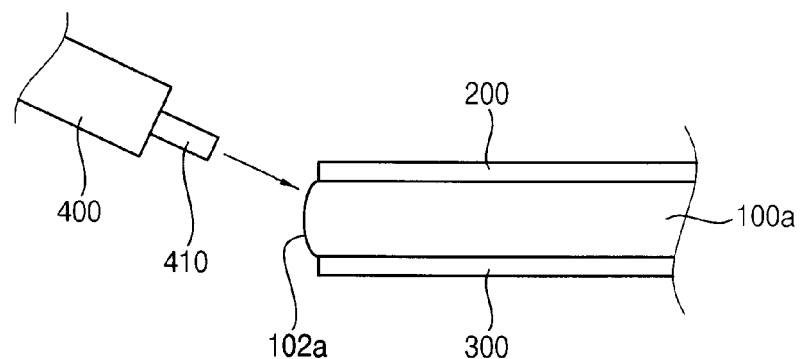

FIGS. 2A to 2B are cross-sectional views briefly illustrating a method of manufacturing a display panel or a display panel using the coating device of FIG. 1

Referring to FIGS. 1 and 2A, after a display panel 100 is aligned between the spaced apart and corresponding upper stage 200 and corresponding lower stage 300, the display panel 100 is lowered so as to be alignably disposed on the lower stage 300. Thereafter, the upper stage 200 is lowered to contact to the top of the display panel 100 for thereby completing the masking of the upper and lower major surfaces of the display panel 100. Accordingly, as only a side surface 102 of the display panel 100 is exposed, ink from a nozzle 410 of the spraying part 400 may be coated exclusively on the side surface 102 of the display panel 100 without affecting at least one of the upper and lower major surfaces of the display panel 100. In other words, the upper stage 200 and the lower stage 300 prevent the ink from being coated on the upper and lower surfaces of the display panel 100, so that the ink may be coated only on the side surface 102. Thus, the light blocking coating layer may be formed on the side surface 102. The ink may be spayed on the side surface 102 by a spray type.

The ink may be a pigment type ink including a shading agent configured to prevent light leakage of the display panel 100. For example, the ink may include a resin, a pigment or the like to have light blocking function and tolerance for isopropyl alcohol. In addition, the ink may preferably include a quick drying solvent because the ink is coated by spray type. Thus, the ink may include proper solvent, so that the solvent may be dried in about 5 seconds after the ink is spayed under normal ambient conditions. (It is however, within the contemplation of the present disclosure to instead further provide the sidewall coating apparatus within a temperature controlled and/or pressure controlled chamber wherein the flows of various gases and vapors are better controlled so as to assure precise control over the spraying and drying processes.

Referring to FIGS. 1 and 2B, illustrated elements are substantially same as that of FIG. 2A except for that a side surface 102a of a display panel 100a is a curved surface. Thus, any further detailed descriptions concerning the same elements will be omitted.

The side surface 102a of the display panel 100a may be a curved surface having swollen central portion. Accordingly, a boundary of an upper stage 200 is aligned with a portion where the side surface 102a and an upper surface of the display panel 100a contact each other. A boundary of the lower stage 300 is aligned with a portion where the side surface 102a and a lower surface of the display panel 100a contact each other. Accordingly, only a curved side surface 102a of the display panel 100a is exposed, ink from a nozzle 410 of a spraying part 400 may be coated on the side surface 102a of the display panel 100a. The upper stage 200 and the lower stage 300 prevent the ink from being coated on the upper and lower surfaces of the display panel 100a, so that the ink may be coated only on the side surface 102a. Thus, the light blocking coating layer may be formed on the side surface 102a. The ink may be spayed on the side surface 102a by a spray type.

The spraying part 400 may be connected to a multi joint robot, so that position of the spraying part 400 may be adjusted depending on needs. The nozzle 410 of the spraying part 400 may preferably be spaced apart the side surface 102a of the display panel 100a. The nozzle 410 may preferably be perpendicular to a tangent of the central point on the side surface 102a that is currently being targeted by the cone of outgoing ink droplets. The nozzle 410 sprays ink to the side surface 102a which is perpendicular to the nozzle 410, the ink may be uniformly spayed, so that the light blocking coating layer may have uniform thickness.

Figure 3:
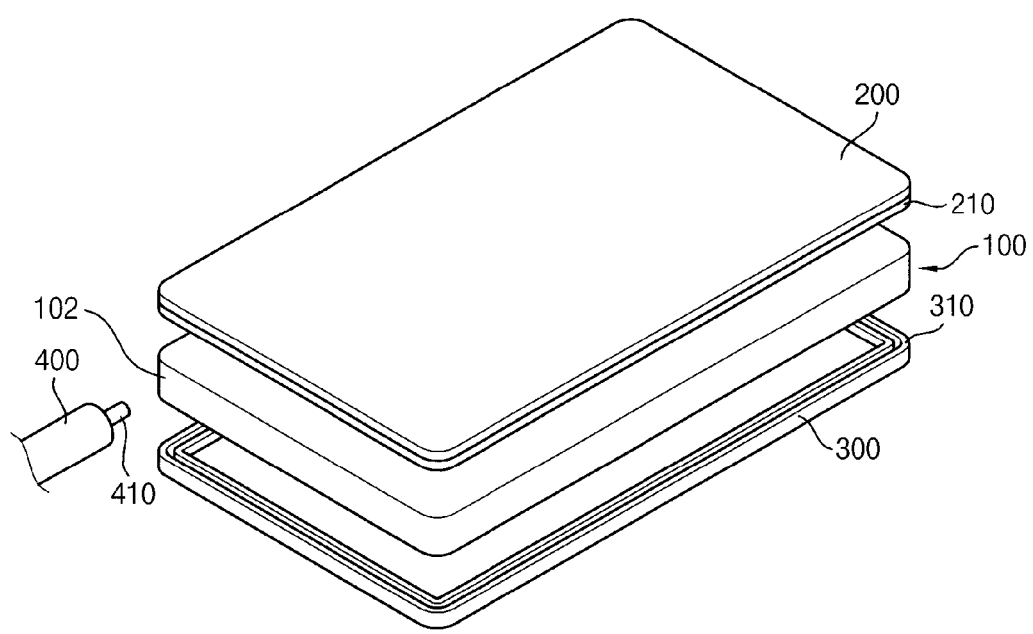
FIG. 3 is a perspective view briefly illustrating a coating device according to an exemplary embodiment.
Figure 4:
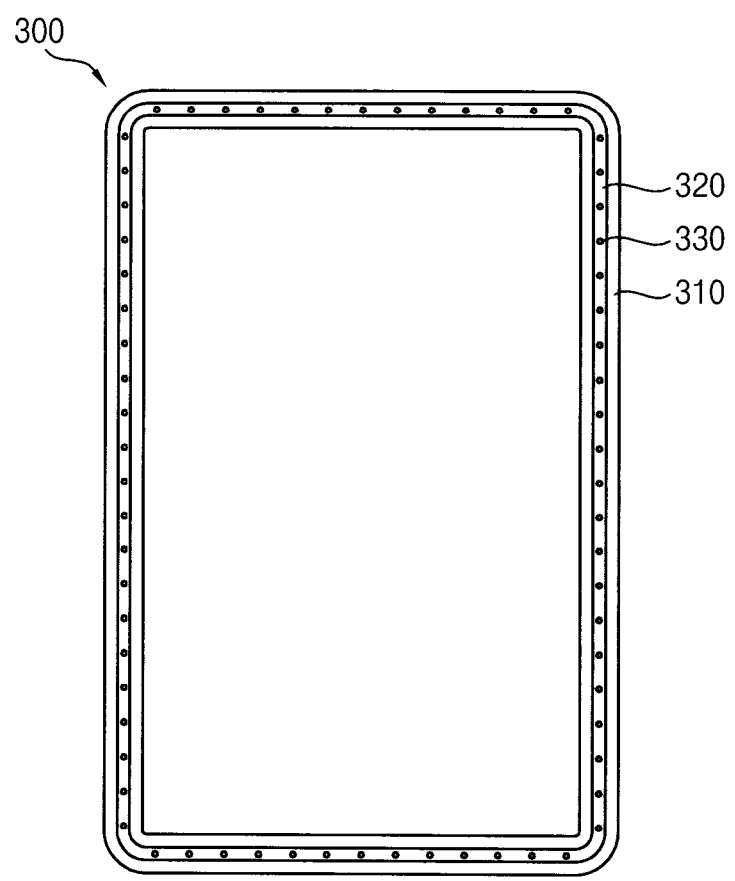
FIG. 4 is a plan view illustrating a lower stage of the coating device of FIG. 3.

FIG. 3 is a perspective view briefly illustrating a coating device according to an exemplary embodiment of the invention. FIG. 4 is a plan view illustrating a lower stage of the coating device of FIG. 3.

Referring to FIGS. 3 and 4, the coating device is substantially same as a coating device of FIG. 1, except for addition of an upper contacting portion 210 and a lower protrusion 310. Thus, any further detailed descriptions concerning the same elements will be omitted.

An upper contacting portion 210 is disposed along a boundary of an upper stage 200 under the upper stage 200. The upper contacting portion 210 directly makes contact with an upper surface of the display panel 100. The upper contacting portion 210 may include a smoothed elastic material such as urethane or the like such that the upper stage 200 may be elastically pressed against the corresponding portion of the upper major surface of the display panel 100 without damaging the upper major surface.

A protrusion 310 is formed on a lower stage 300 along a boundary of the lower stage 300. The protrusion 310 contacts to a lower surface of the display panel 100. A first groove 320 is formed on the protrusion 310. The first groove 320 extends along the protrusion 310. One or more air holes 330 are formed in the first groove 320. Air (and/or other gas or vapor) is continually provided to the first groove 320 from the air hole(s) 330, so that an air cushion or wall is formed along the first groove 320. The air wall prevents ink of a spraying part 400 from dripping down due to gravity after being sprayed and then collecting on an inside portion of a lower surface of the display panel 100. Thus, not only the protrusion 310 but also the air wall in the first groove 320 prevents the ink from collecting nonuniformly and undesirably on the lower surface of the display panel 100. Further detailed explanation will be mentioned in FIGS. 5A to 5C.

FIGS. 5A to 5D are cross-sectional views briefly illustrating a method of manufacturing a display panel or a display panel using the coating device of FIG. 3.

Figure 5A:
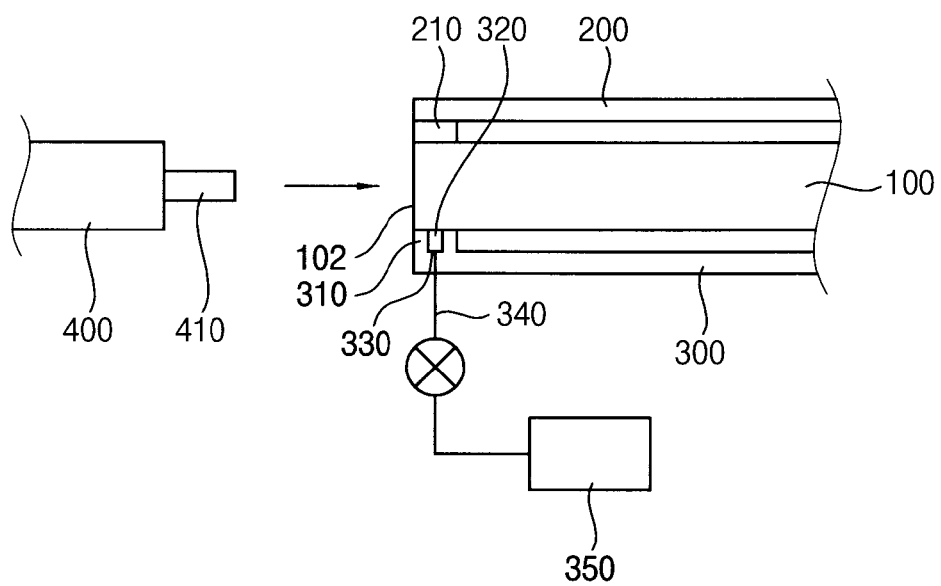
FIGS. 5A to 5D are cross-sectional views briefly illustrating a method of manufacturing a display panel or a display panel using the coating device of FIG. 3.

Referring to FIGS. 3, 4 and 5A, after a display panel 100 is aligned between an upper stage 200 and a lower stage 300, the display panel 100 is disposed on the lower stage 300. A protrusion 310 of the lower stage 300 contacts to a boundary of the lower surface of the display panel 100. Thereafter, the upper stage 200 contacts to the display panel 100 for masking upper and lower surfaces of the display panel 100. An upper contacting portion 210 dispose under a boundary of the upper stage 200 contacts to the upper surfaces of the display panel 100, so that ink from a nozzle 410 of the spraying part 400 may not be coated on the upper surfaces of the display panel 100.

Accordingly, as a side surface 102 of the display panel 100 is exposed, ink from a nozzle 410 of the spraying part 400 may be coated on the side surface 102 of the display panel 100. The upper contacting portion 210 and the protrusion 310 prevent the ink from being coated on the upper and lower surfaces of the display panel 100, so that the ink may be coated only on the side surface 102. Thus, the light blocking coating layer may be formed on the side surface 102. The ink may be spayed on the side surface 102 by a spray type.

The ink may be a pigment type ink including a shading agent configured to prevent light leakage of the display panel 100. For example, the ink may include a resin, a pigment or the like to have light blocking function and tolerance for isopropyl alcohol. In addition, the ink may preferably include a quick drying solvent because the ink is coated by spray type. Thus, the ink may include proper solvent, so that the solvent may be dried in about 5 seconds after the ink is spayed.

One or more air holes 330 is/are formed in the first groove 320 of the protrusion 310. The air hole(s) 330 is/are connected to an air supplying part 350 through an air supplying line (e.g., hose) 340. Air supplied from the air supplying part 350 through the air supplying line 340 is sprayed through the air hole 330, so that an air wall (cushion) is formed in the first groove 320. Thus, if the ink leaks into a tiny gap (not visible in FIGS. 5A-5B) between the protrusion 310 and the display panel 100, the ink can not pass the air wall in the first groove 320, so that the air wall may effectively prevent the ink from collecting there or being coated on a inside portion of a lower surface of the display panel 100 with reference to the first groove 320.

Figure 5B:
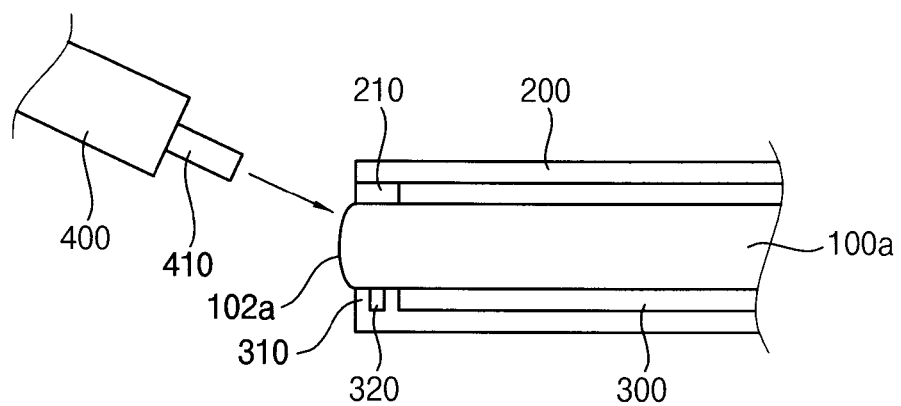

Referring to FIGS. 3, 4 and 5B, illustrated elements are substantially same as that of FIG. 5A except for that a side surface 102a of a display panel 100a is a curved surface. Thus, any further detailed descriptions concerning the same elements will be omitted.

The side surface 102a of the display panel 100a may be a curved surface having swollen central portion. Accordingly an upper contacting portion 210 under a boundary of an upper stage 200 is aligned with a portion where the side surface 102a and an upper surface of the display panel 100a contact each other. A protrusion 310 on a boundary of the lower stage 300 is aligned with a portion where the side surface 102a and a lower surface of the display panel 100a contact each other. Accordingly, only a side surface 102a of the display panel 100a is exposed, ink from a nozzle 410 of a spraying part 400 may be coated on the side surface 102a of the display panel 100a. The upper contacting portion 210 and the protrusion 310 prevent the ink from being coated on the upper and lower surfaces of the display panel 100a, so that the ink may be coated only on the side surface 102a. Thus, the light blocking coating layer may be uniformly formed on the side surface 102a with collecting due to gravity and surface wetting more (and thus to a greater thickness) at the lower lip than higher up. The ink may be spayed on the side surface 102a by a spray type.

The ink may be a pigment type ink including a shading agent configured to prevent light leakage of the display panel 100a. For example, the ink may include a resin, a pigment or the like to have light blocking function and tolerance for isopropyl alcohol. In addition, the ink may preferably include a quick drying solvent because the ink is coated by spray type. Thus, the ink may include proper solvent, so that the solvent may be dried in about 5 seconds after the ink is spayed.

Figure 5C:
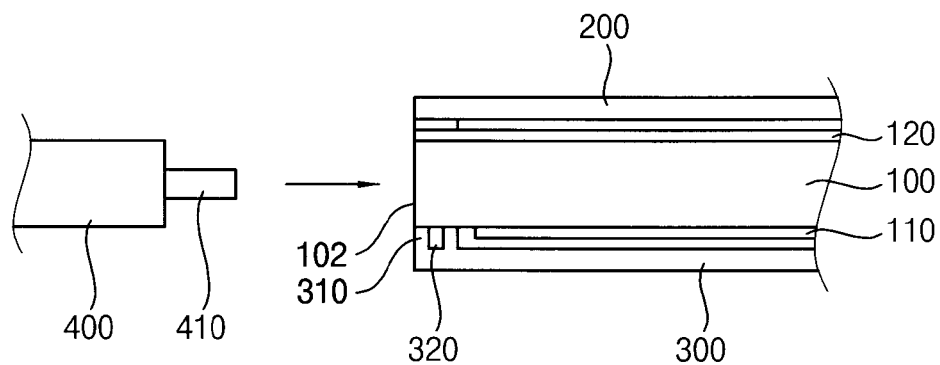

Referring to FIGS. 3, 4 and 5C, illustrated elements are substantially same as that of FIG. 5A except for that a display panel 100 includes a lower polarizer 110 and an upper polarizer 120 (for example in the form of polarizer sheets or plates). Thus, any further detailed descriptions concerning the same elements will be omitted.

The display panel 100 includes the upper polarizer 120 disposed on the display panel 100 and the lower polarizer 110 disposed under the display panel 100.

The upper polarizer 120 has a boundary shape substantially same as a boundary shape an upper surface of the display panel 100. Thus, a side surface of the upper polarizer 120 and a side surface of the display panel 100 are disposed in a same plane. In addition, a boundary shape of the lower polarizer 110 is smaller than that of a lower surface of the display panel 100. Thus, a boundary of the lower surface of the display panel 100 is exposed by the lower polarizer 110, so that a step is formed at a boundary of the lower polarizer 110.

An upper contacting portion 210 disposed under a boundary of the upper stage 200 makes contact with a boundary of the upper surface of the upper polarizer 120, so that upper contacting portion 210 may prevent ink of a splaying part 400 form being spayed on the upper surface of the upper polarizer 120.

A protrusion 310 of the lower stage 300 directly contacts to the exposed portion (beyond the boundary of the lower polarizer 110) of the boundary of the lower major surface of the display panel 100. Thus, the protrusion 310 directly contacts to the display panel 100 regardless of the step formed by the lower polarizer 110, so that the protrusion 310 may prevent ink of a splaying part 400 form being spayed on the lower surface of the display panel 100.

Figure 5D:
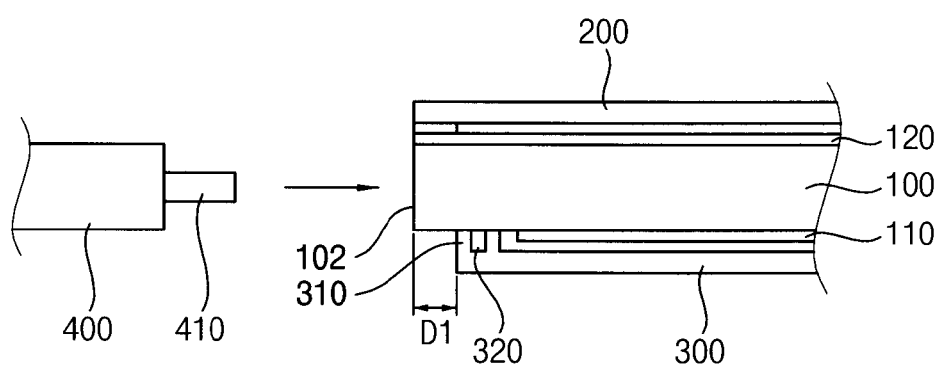

Referring to FIGS. 3, 4 and 5D, illustrated elements are substantially same as that of FIG. 5C except for that a protrusion 310 of a lower stage 300 is spaced apart and inwardly from an outer boundary (defined by the sidewall 102) of the lower major surface of the display panel 100 by a first length D1. Thus, any further detailed descriptions concerning the same elements will be omitted.

The protrusion 310 of the lower stage 300 is spaced apart from a side surface 102 of the display panel 100 by the first length D1. The protrusion 310 of the lower stage 300 directly contacts to an exposed portion of the boundary of the lower surface of the display panel 100.

The protrusion 310 is spaced apart from and inward of a side surface 102 of the display panel 100 by the first length D1, so that a portion of the lower surface of the display panel 100 is exposed. Thus, ink may be spayed on the side surface 102 of the display panel 100 and also on a portion of the lower major surface of the display panel 100 adjacent to the side surface 102 (as a first length D1), so that a light blocking coating layer may be formed in both places. (Refer also to FIG. 11D.)

The light blocking coating layer is formed by sparing method, so that the first length D1 may be precisely controlled.

Figure 6:
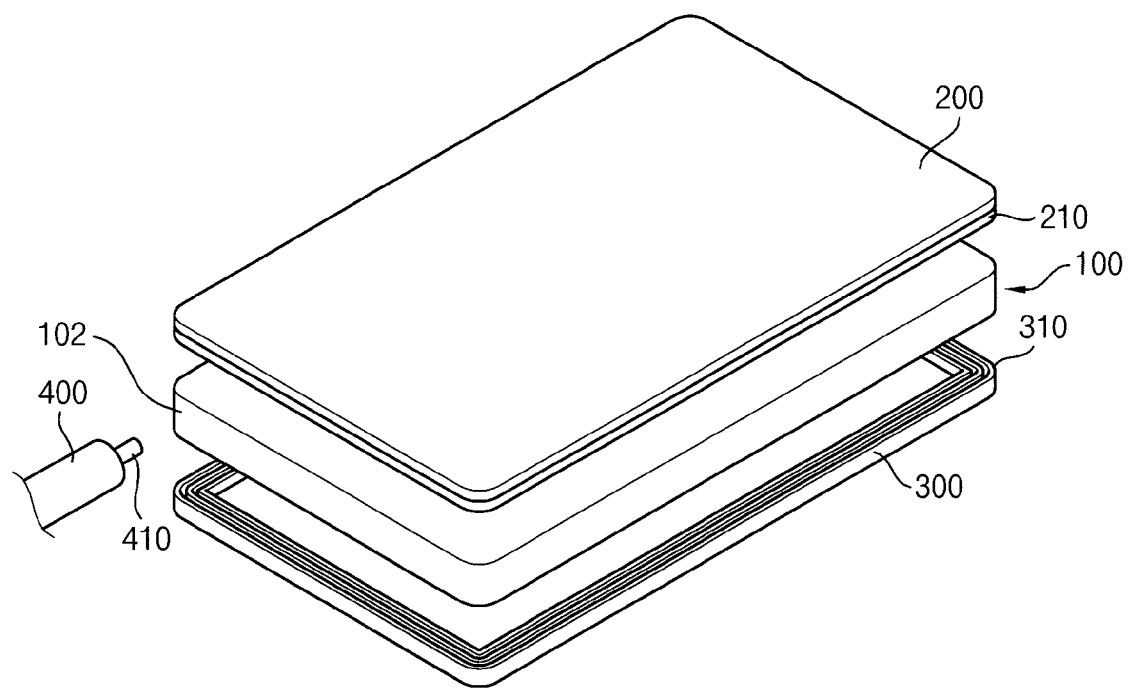
FIG. 6 is a perspective view briefly illustrating a coating device according to an exemplary embodiment.
Figure 7:
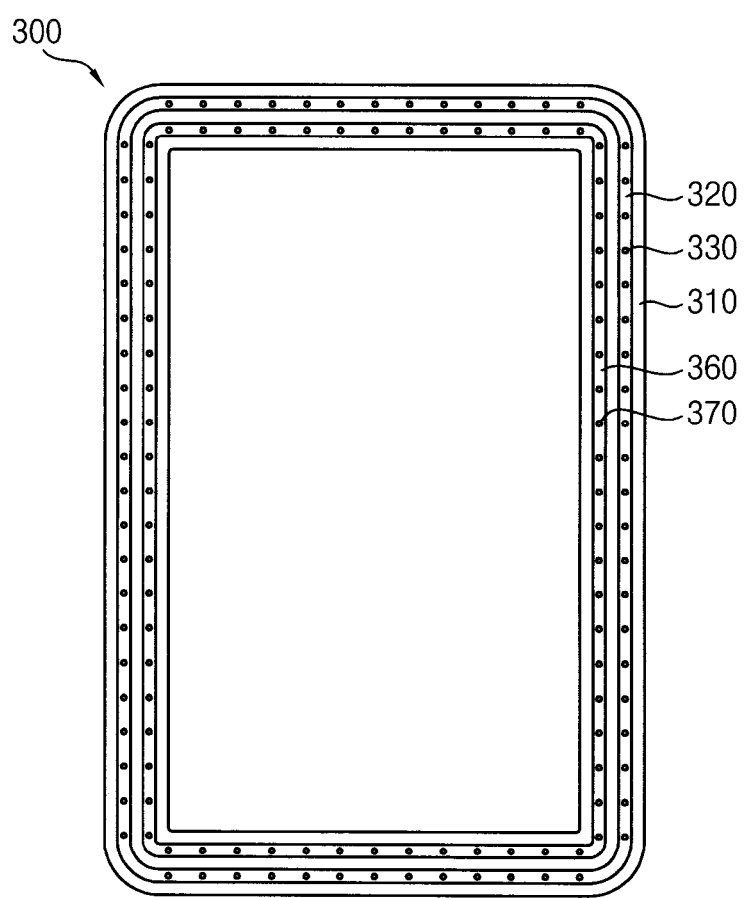
FIG. 7 is a plan view illustrating a lower stage of the coating device of FIG. 6.

FIG. 6 is a perspective view briefly illustrating a coating device according to a further exemplary embodiment. FIG. 7 is a plan view illustrating a lower stage of the coating device of FIG. 6.

Referring to FIGS. 6 and 7, the coating device is substantially same as a coating device of FIGS. 3 and 4 except for having a second groove 360 in the lower stage 300 and a lower contacting portion. (refers to 315 of FIG. 8, not shown in FIGS. 6 and 7) Thus, any further detailed descriptions concerning the same elements will be omitted.

The second groove 360 is formed in protrusion 310 of the lower stage 300, and is spaced apart from the first groove 320 that is also formed in protrusion 310. The second groove 360 is disposed opposite to a side surface 102 of the display panel 100 with reference to the first groove 320. The second groove 360 extends along the protrusion 310. One or more vacuum holes (low pressure providing holes) 370 is/are formed in the second groove 360. Air in the second groove 360 is thus sucked out through the vacuum hole 370, so that a suction force is created in the second groove 360.

The suction force in the second groove 360 may be used to affix to (attach to) the display panel 100 at a proper position. For example, the display panel 100 is aligned on the lower stage 300. Thereafter, the display panel 100 is fixed on the lower stage 300 using the suction force in the second groove 360. Although an air (and/or other gas/vapor) pushing-out wall is formed in the first groove 320 and applies pushing-away forces to the display panel 100, the suction force of the second groove 360 is stronger and thus may firmly fix the display panel 100 at the proper position. In addition, air from an air hole 330 of the first groove 320 may be partially discharged through the vacuum hole 370 of the second groove 360, so that air pressure nearby the first and second grooves 320 and 360 may be properly maintained.

Figure 8:
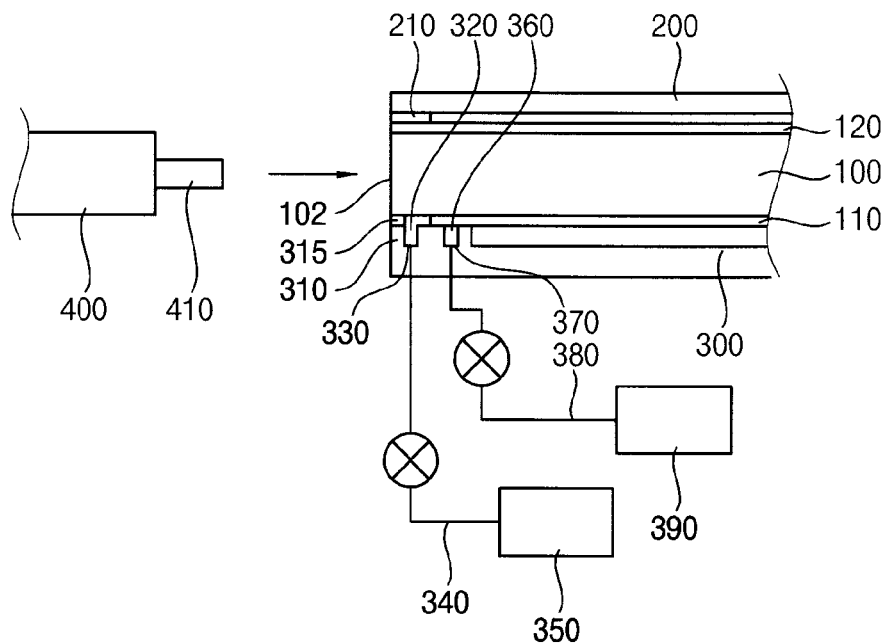
FIG. 8 is a cross-sectional view briefly illustrating a method of manufacturing a display panel or a display panel using the coating device of FIG. 6.

FIG. 8 is a cross-sectional view briefly illustrating a method of manufacturing a display panel or a display panel using the coating device of FIG. 6

Referring to FIGS. 6, 7 and 8, illustrated elements are substantially same as that of FIG. 5C except for a lower contacting portion 315, a second groove 370, and of vacuum generating part 390. Thus, any further detailed descriptions concerning the same elements will be omitted.

The lower contacting portion 315 is formed on a protrusion 310 of a lower stage 300 along a boundary of the protrusion 310. The lower contacting portion 315 directly contacts to a lower surface of a display panel 100, so that the lower contacting portion 315 may include an elastic material. For example, the lower contacting portion 315 may include urethane or the like.

The protrusion 310 supports form the lower surface of the display panel 100 adjacent to a side surface 102 of the display panel to a boundary of a lower polarizer 110. Thus, a portion of the protrusion 310, where a second groove 360 is formed, contacts to the lower polarizer 110. A portion of the protrusion 310 where a first groove 320 is formed, faces an exposed portion of the lower surface of the display panel 100 by the lower polarizer 110. The lower contacting portion 315 directly contacts the exposed portion of the lower surface of the display panel 100. Accordingly, firstly, the lower contacting portion 315 may prevent ink form being sprayed on the lower surface of the display panel 100. Thereafter, secondly, a pushing-out air wall in the first groove 320 may prevent ink from nonuniformly collecting to a greater extent near the lower surface of the display panel 100. Thus, unwanted coating at unwanted portion may be prevented during spraying process.

Figure 9:
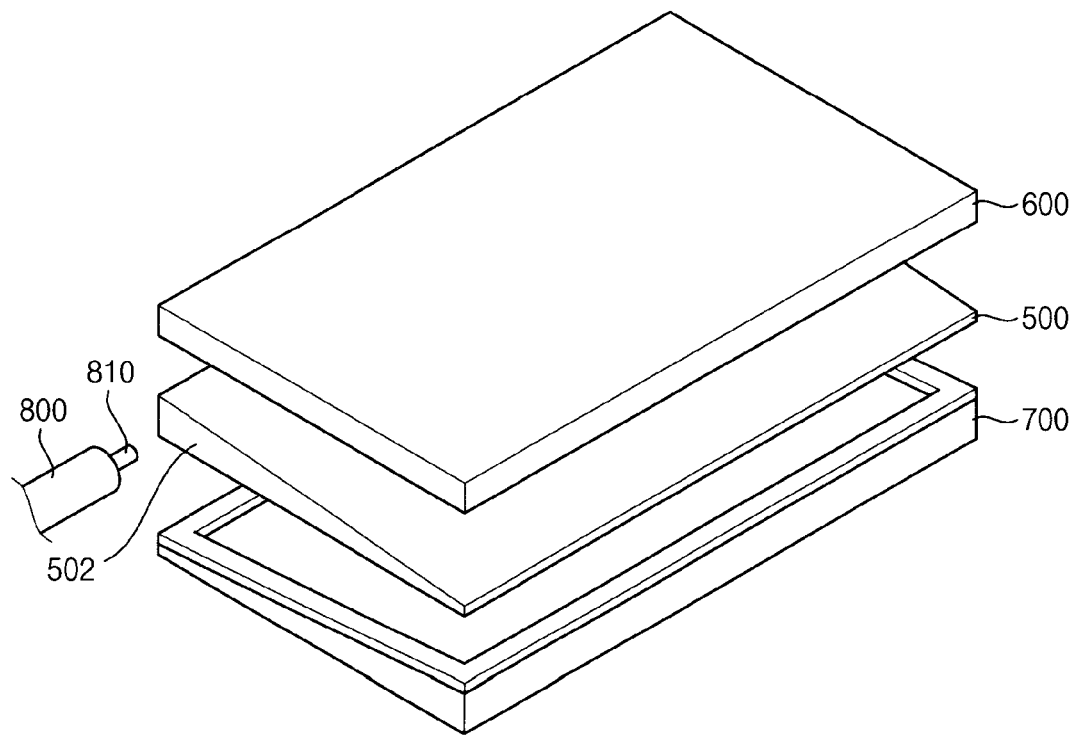
FIG. 9 is a perspective view briefly illustrating a coating device according to an exemplary embodiment.
Figure 10:
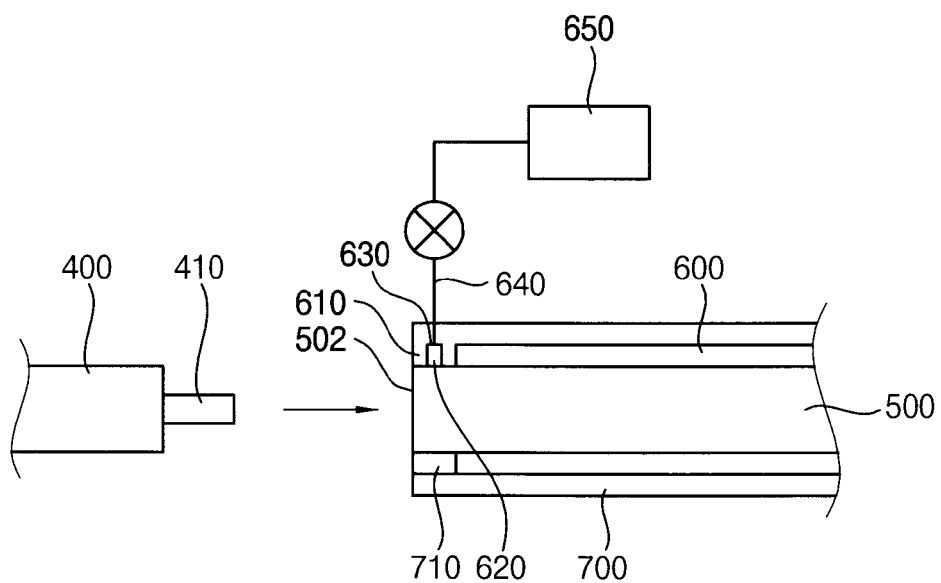
FIG. 10 is a cross-sectional view briefly illustrating a method of manufacturing a display panel or a display panel using the coating device of FIG. 9.

FIG. 9 is a perspective view briefly illustrating a coating device according to an exemplary embodiment of the invention. FIG. 10 is a cross-sectional view briefly illustrating a method of manufacturing a display panel or a display panel using the coating device of FIG. 9.

Referring to FIGS. 9 and 10, the coating device includes a lower stage 700, an upper stage 600 and a spraying part 800.

The upper stage 600 and the lower stage 700 are spaced apart and face each other. A light guiding plate 500 which may be the target (or part of the target) for ink coating on its sidewalls is disposed between the upper stage 600 and the lower stage 700. The light guiding plate 500 may be a light guiding plate for a backlight assembly of display apparatus.

Each of the upper stage 600 and the lower stage 700 have a plane shape substantially the same as that of the light guiding plate 500. A side surface (refers to 502 of FIG. 10) which is not covered with the upper stage 600 and the lower stage 700 is exposed. The spraying part 800 sprays ink (e.g., one including a white or reflective inner layer) to the side wall surface 502, so that a reflecting coating layer may be formed on the side surface 502.

The upper stage 600 and the lower stage 700 may include metal. For example, the upper stage 600 and the lower stage 700 may include aluminum or aluminum alloy.

A protrusion 610 contacting a boundary of an upper surface of the light guiding plate 500 is formed on the upper stage 600. A first groove 620 is formed in the protrusion 610. The first groove 620 extends along the protrusion 610. One or more air holes 630 is/are formed in the first groove 620. The air hole(s) 630 is/are connected to an air supplying part 650 through air supplying line 640. Air from the air supplying part 650 through air supplying line 640 is sprayed through the air hole 630 configured to form an air wall in the first groove 620. The air wall may prevent ink from being sprayed on inside of the upper surface of the light guiding plate 500 with reference to the first groove 620. Thus, not only the protrusion 610 but also the air wall in the first groove 620 prevents the ink from being sprayed onto the upper surface of the light guiding plate 500.

A lower contacting portion 710 is disposed on a boundary of an upper surface of the lower stage 700. The lower contacting portion 710 directly contacts to a lower surface of the light guiding plate 500, so that the lower contacting portion 710 may include an elastic material. For example, the lower contacting portion 710 may include urethane or the like.

The spraying part 800 includes a nozzle 810 for spraying the inwardly-reflecting ink. The spraying part 800 may move along the side surface 502 of the light guiding plate 500, and sprays the ink to the side surface 502 except for a light incident surface, so that a reflecting coating layer may be formed on the side surface 502. The ink may be spayed by a spray type.

The ink may include light reflecting material configured to reflect and to prevent light leakage of the light guiding plate 500. In addition, the ink may preferably include a quick drying solvent because the ink is coated by spray type. Thus, the ink may include proper solvent, so that the solvent may be dried in about 5 seconds after the ink is spayed.

Although not shown in figures, the spraying part 800 may be connected to a multi-joint robot, so that position of the spraying part 800 may be adjusted depending on needs. The nozzle 810 of the spraying part 800 may preferably be spaced apart the side surface 502 of the light guiding plate 500. The nozzle 810 may preferably be perpendicular to the side surface 502 of the light guiding plate 500.

FIGS. 11A to 11D are cross-sectional views briefly illustrating a display substrate or a display panel manufactured using the coating device according to the present disclosure of invention.

Figure 11A:
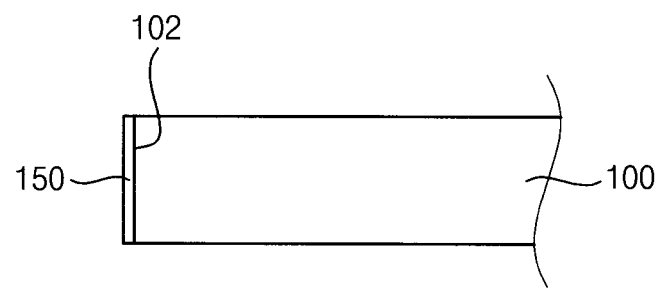
FIGS. 11A to 11D are cross-sectional views briefly illustrating a display substrate or a display panel manufactured using the coating device according to the present disclosure.

Referring to FIG. 11A, a light blocking coating layer 150 of uniform thickness is disposed on a side surface 102 of the display panel 100 (or display substrate). The light blocking coating layer 150 is formed by using a coating device according to the present disclosure. The light blocking coating layer 150 may include a resin, a pigment or the like that has a light blocking and/or inwardly reflecting function and tolerance for isopropyl alcohol.

The light blocking coating layer 150 is formed by spraying method, so that the light blocking coating layer 150 may have relatively thin and of uniform thickness. For example, thickness of the light blocking coating layer 150 may be no more than about 5 μm. For example, the thickness of the light blocking coating layer 150 may be about 1 μm to about 5 μm.

Figure 11B:
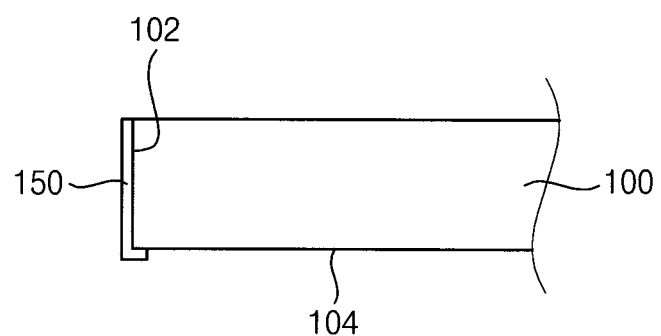

Referring to FIG. 11B, a light blocking coating layer 150 is disposed on a side surface 102 of the display panel 100 (or display substrate). In addition, the light blocking coating layer 150 extends to cover an edge boundary of a lower surface 104 of the display panel 100. Thus, a cross-section of the light blocking coating layer 150 may have an L shape as shown. The light blocking coating layer 150 is formed by using a coating device according to the present disclosure. The light blocking coating layer 150 may include a resin, a pigment or the like to have light blocking function and tolerance for isopropyl alcohol.

The light blocking coating layer 150 is formed by spraying method, so that the light blocking coating layer 150 may have relatively thin and uniform thickness. For example, thickness of the light blocking coating layer 150 may be no more than about 5 μm. For example, the thickness of the light blocking coating layer 150 may preferably be about 1 μm to about 5 μm. The light blocking coating layer 150 is formed by using a coating device according to the present disclosure, so that the length of a portion of the light blocking coating layer 150 covering the lower surface 104 may be precisely controlled. For example, the light blocking coating layer 150 covers the side surface 102 of the display panel 100, and covers a portion of the lower surface 104 from the side surface 102 to about 0.6 mm to about 1 mm inwardly of the edge.

Figure 11C:
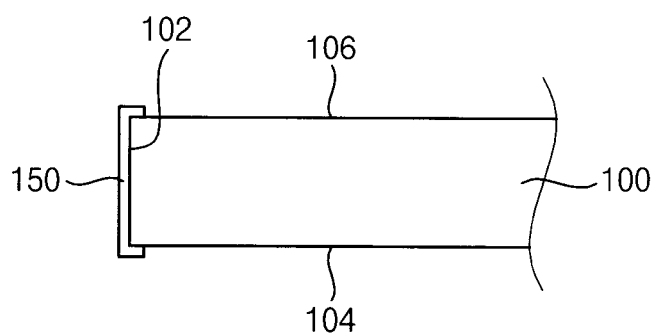

Referring to FIG. 11C, a light blocking coating layer 150 is disposed on a side surface 102 of the display panel 100 (or display substrate). In addition, the light blocking coating layer 150 extends to cover a boundary of a lower surface 104 of the display panel 100 and extends to cover a boundary of an upper surface 106 of the display panel 100. Thus, a cross-section of the light blocking coating layer 150 may have a C shape or the like as shown. The light blocking coating layer 150 is formed by using a coating device according to the present disclosure. The light blocking coating layer 150 may include a resin, a pigment or the like to have light blocking function and tolerance for isopropyl alcohol.

The light blocking coating layer 150 is formed by spraying method, so that the light blocking coating layer 150 may have relatively thin and uniform thickness. For example, thickness of the light blocking coating layer 150 may be no more than about 5 μm. For example, the thickness of the light blocking coating layer 150 may preferably be about 1 μm to about 5 μm. The light blocking coating layer 150 is formed by using a coating device according to the present disclosure, so that length of a portion of the light blocking coating layer 150 covering the lower surface 104 may be precisely controlled. For example, the light blocking coating layer 150 covers the side surface 102 of the display panel 100, and covers a portion of the lower surface 104 from the side surface 102 to about 0.6 mm to about 1 mm. In addition, length of a portion of the light blocking coating layer 150 covering the upper surface 106 may be precisely controlled. For example, the light blocking coating layer 150 covers a portion of the upper surface 106 from the side surface 102 to about 0.6 mm to about 1 mm.

Figure 11D:
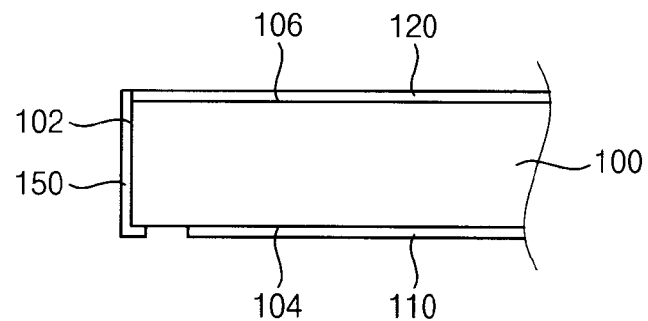

Referring to FIG. 11D, the display panel 100 further include an upper polarizer 120 disposed on the display panel 100, and a lower polarizer 110 disposed under the display panel 100.

The upper polarizer 120 has a boundary shape substantially the same as a boundary shape an upper surface of the display panel 100. Thus, a side surface of the upper polarizer 120 and a side surface of the display panel 100 are disposed in a same plane. In addition, a boundary shape of the lower polarizer 110 is smaller than that of a lower major surface of the display panel 100. Thus, a boundary of the lower surface of the display panel 100 is exposed by the lower polarizer 110, so that a step is formed at a boundary of the lower polarizer 110.

A light blocking coating layer 150 of uniform thickness is disposed on a side surface 102 of the display panel 100. In addition, the light blocking coating layer 150 extends to cover a boundary of a lower surface 104 of the display panel 100. Thus, a cross-section of the light blocking coating layer 150 may have an L shape as shown. The light blocking coating layer 150 is formed by using a coating device according to the present disclosure. The light blocking coating layer 150 may include a resin, a pigment or the like to have light blocking function and tolerance for isopropyl alcohol.

The light blocking coating layer 150 is formed by spraying method, so that the light blocking coating layer 150 may have relatively thin and uniform thickness. For example, thickness of the light blocking coating layer 150 may be no more than about 5 μm. For example, the thickness of the light blocking coating layer 150 may preferably be about 1 μm to about 5 μm. The light blocking coating layer 150 is formed by using a coating device according to the present invention, so that length of a portion of the light blocking coating layer 150 covering the lower surface 104 may be precisely controlled. For example, the light blocking coating layer 150 covers the side surface 102 of the display panel 100, and covers a portion of the lower surface 104 from the side surface 102 to about 0.6 mm to about 1 mm.

An exquisite coating layer with one or more functions that depend on it having uniform or other thickness profile may be formed on a side surface of an object using a coating device according to the present disclosure of invention. For example, a coating layer may be formed on a side surface of a display panel or a display substrate or a light guide plate.

Figure 12:
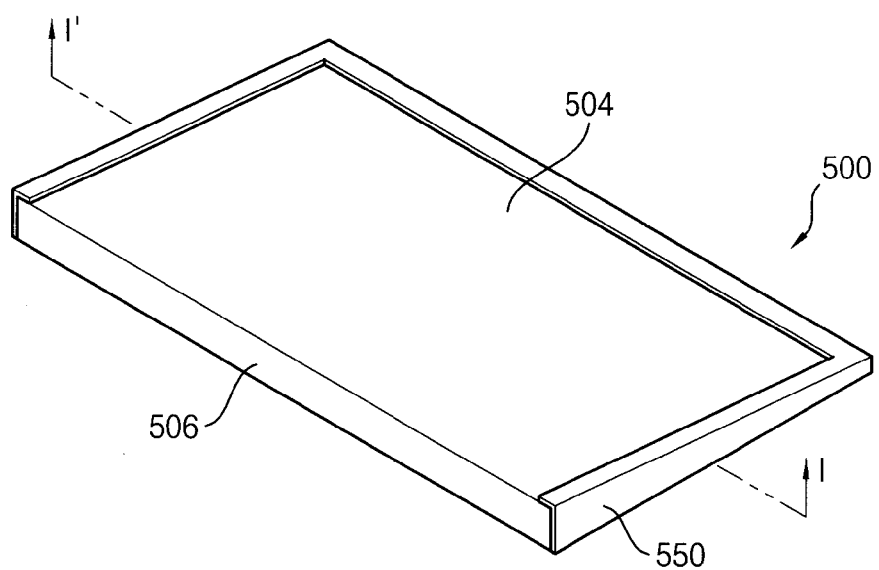
FIG. 12 is a perspective view briefly illustrating a light guiding plate manufactured using the coating device according to the present disclosure.
Figure 13:
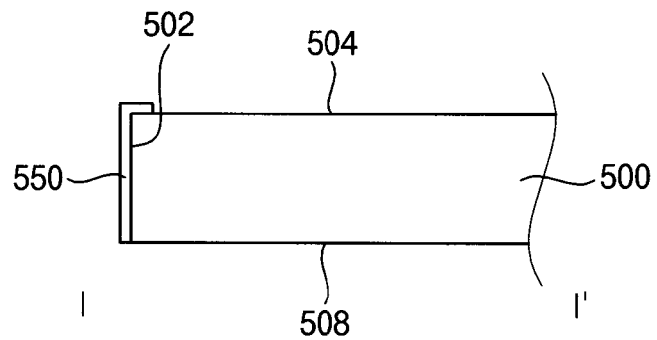
FIG. 13 is a cross-sectional view taken along a line I-I' of FIG. 12.

FIG. 12 is a perspective view briefly illustrating a light guiding plate manufactured using the coating device according to the present disclosure. FIG. 13 is a cross-sectional view taken along a line I-I' of FIG. 12.

The light guiding plate 500 includes a relatively tall, light incident surface 506 into which light enters from an adjacent light source bar (not shown), an opposed and optionally less tall opposed surface, a top light exiting surface 504 disposed adjacent to the light incident surface 506 and through which redirected light exits, a lower surface 508 (see FIG. 13) disposed opposite to the light exiting surface 504, and a side surface 502 connecting the light exiting surface 504 and the lower surface 508. A reflecting coating layer 550 is formed on the side surface 502 but not on the light incident surface 506. The reflecting coating layer 550 reflects light originated from the light incident surface 506 such that it is more efficiently output through the light exiting surface 504. The reflecting coating layer 550 may extend to cover a boundary of the light exiting surface 504. In addition, a bottom reflecting plate (refers to 510 of FIG. 15A) may be disposed under the lower surface 508.

The reflecting coating layer 550 may include material having a reflecting function.

Figure 14:
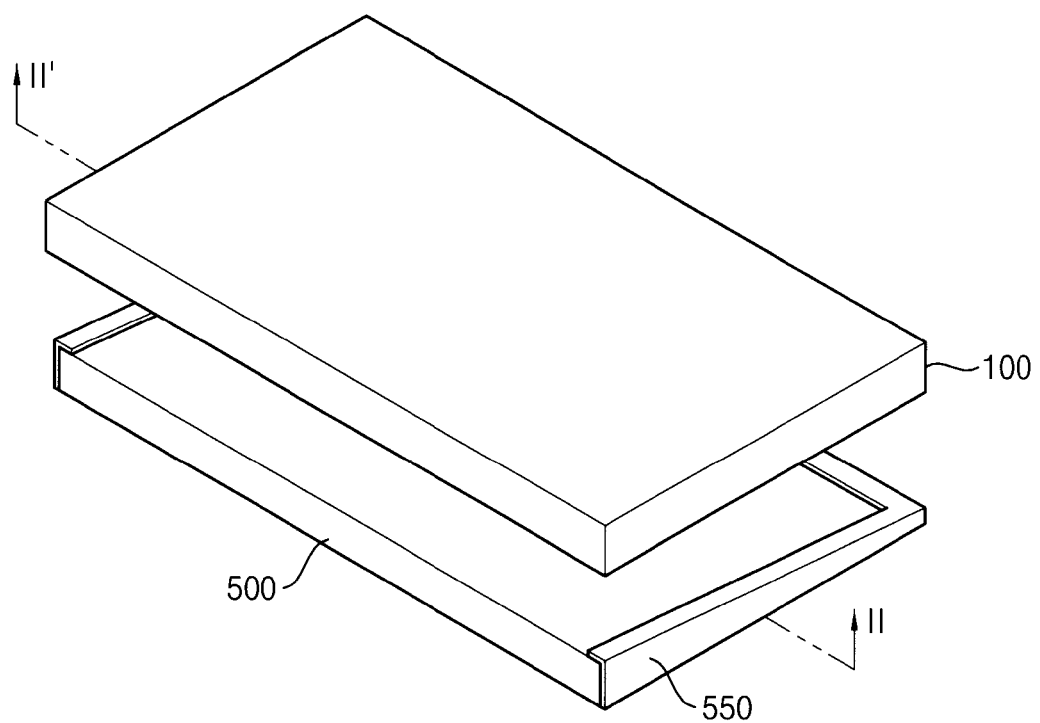
FIG. 14 is a perspective view briefly illustrating a display panel and a light guiding plate manufactured using the coating device according to the present disclosure.

FIG. 14 is a perspective view briefly illustrating a display panel and a light guiding plate manufactured using the coating device according to the present disclosure of invention.

The display apparatus includes a display panel 100 and a light guiding plate 500 disposed under the display panel 100. Although not shown in figures, the display apparatus may further include a backlight assembly including the light guiding plate 500 and a light source, and a receiving container receiving the display panel 100 and the backlight assembly.

Figure 15A:
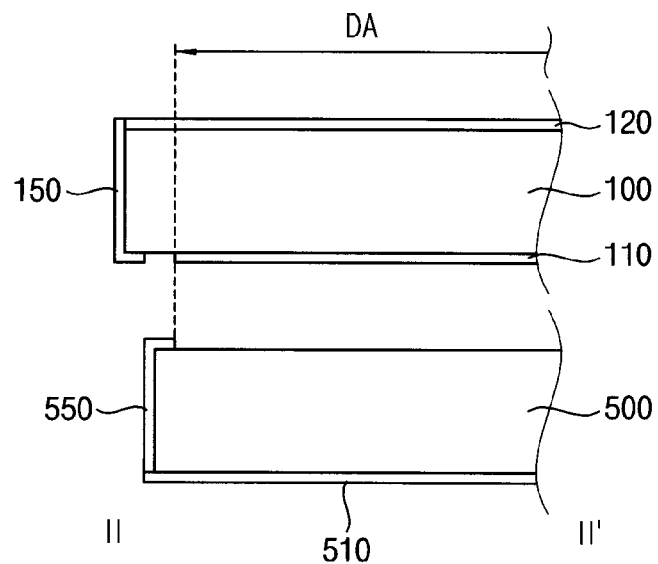
FIGS. 15A to 15B are cross-sectional views of the display panel and the light guiding plate taken along a line II-II' of FIG. 14.
Figure 15B:
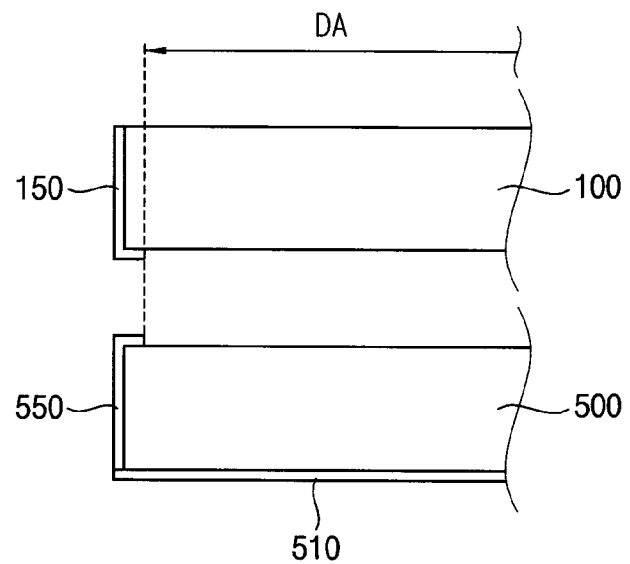

FIGS. 15A to 15B are cross-sectional views of the display panel and the light guiding plate taken along a line II-II' of FIG. 14.

Referring to FIGS. 14 and 15A, a light blocking coating layer 150 is disposed on a side surface of the display panel 100. In addition, the light blocking coating layer 150 extends to cover a boundary of a lower surface of the display panel 100. Thus, a cross-section of the light blocking coating layer 150 may have an L shape.

A reflecting coating layer 550 is formed on the side surface of a light guiding plate 500. The reflecting coating layer 550 may extend to cover a boundary of a light exiting surface of the light guiding plate 500. A reflecting plate 510 is disposed on a lower surface opposite to the light exiting surface of the light guiding plate 500.

The display panel 100 is disposed over the light guiding plate 500. The display panel 100 is spaced apart from the light guiding plate 500 (for example by transparent spacers, not shown). The display panel 100 includes a display area DA configured for displaying an image. A boundary of the display area DA may be corresponds to boundary of a lower polarizer 110. (refers dotted line in figure) Thus, while light from the light guiding plate 500 is supplied to the display area DA through the lower polarizer 110, light leakage may be prevented, so that light efficiency may be improved.

Referring to FIGS. 14 and 15B, illustrated elements are substantially same as that of FIG. 15A except for that alignment relation between a display panel 100 and a light guiding plate 500. Thus, any further detailed descriptions concerning the same elements will be omitted.

The display panel 100 is disposed over the light guiding plate 500. The display panel 100 is spaced apart from the light guiding plate 500. The display panel 100 includes a display area DA displaying an image. A boundary of the display area DA may be corresponds to an end of a light blocking coating layer 150 disposed on a lower surface of the display panel 100. A boundary of the display area DA may be corresponds to an end of a reflecting coating layer 550 of an upper surface of the light guiding plate 500. (refers dotted line in figure) Thus, while light from the light guiding plate 500 is supplied to the display area DA through a lower polarizer 110, light leakage may be prevented, so that light efficiency may be improved.

According to the exemplary embodiments of the present disclosure of invention, the coating device includes the upper stage and the lower stage, so that the coating device may form a coating layer by precisely spraying ink. In addition, a cross-section of the coating layer may be precisely formed having specific shape such as an L shape or a C shape or the like in accordance with the present teachings.

In addition, a display apparatus having high light efficiency and reducing light leakage may be provided by using the coating device and a display panel and/or a light guide plate coated on its sidewalls with a uniform light reflecting and/or light blocking coating.

The foregoing is illustrative of the present disclosure of invention and is not to be construed as limiting thereof. Although a few exemplary embodiments in accordance with the disclosure have been described, those skilled in the art will readily appreciate in light of the foregoing that many modifications are possible in the exemplary embodiments without materially departing from the novel teachings and advantages of the present disclosure. Accordingly, all such modifications are intended to be included within the scope of the present teachings. In the claims, means-plus-function clauses are intended to cover the structures described herein as performing the recited function and not only structural equivalents but also functionally equivalent structures.

What is claimed is:

1. A coating device comprising:
an upper stage covering an entire upper surface of a display panel;
a lower stage covering an entire lower surface of the display panel; and
a spraying part spraying ink to a side surface of the display panel, the side surface being exposed between the upper stage and the lower stage,
wherein the upper stage comprises a lower surface having a shape substantially the same as that of an upper surface of the display panel, and the lower stage comprises an upper surface having a shape substantially the same as that of a lower surface of the display panel, and
wherein the lower or upper stage comprises a protrusion disposed on a boundary of the upper surface of the lower stage or on a boundary of the lower surface of the upper stage.

2. The coating device of claim 1, wherein the upper stage further comprises an upper contacting portion disposed on the boundary of the lower surface of the upper stage, and the upper contacting portion is configured to contact to a boundary of the upper surface of the display panel.

3. The coating device of claim 1, wherein the protrusion is disposed on the boundary of the upper surface of the lower stage.

4. The coating device of claim 3, wherein a first groove is formed on the protrusion, a plurality of air holes for forming an air wall are formed in the first groove, and the air holes are connected to an air supplying part configured for supplying pressurized air.

5. The coating device of claim 4, wherein a second groove is formed on the protrusion, a plurality of vacuum holes sucking air in the second groove is formed in the second groove, and the vacuum holes are connected to vacuum generating part configured for forming a vacuum.

6. The coating device of claim 5, wherein the lower stage further comprises a lower contacting portion disposed on the protrusion, and the lower contacting portion is configured to contact to a boundary of the lower surface of the display panel.

7. The coating device of claim 3, wherein the protrusion is disposed to be spaced apart from the side surface of the display panel by a first length toward an inside of the display panel, so that a boundary of the lower surface of the display panel will be exposed when the display panel is sandwiched between the upper and lower stages.

8. The coating device of claim 3, further comprising an upper polarizer disposed on the display panel, and a lower polarizer disposed under the display panel,
the lower polarizer is smaller than the display panel in a plan view, a boundary of the lower surface of the display panel is exposed, and
the protrusion contacts to the boundary of the lower surface of the display panel.

9. The coating device of claim 1, wherein the ink has tolerance for isopropyl alcohol.

10. The coating device of claim 1, wherein a nozzle of the spraying part is spaced apart from the side surface of the display panel, the nozzle is perpendicular to the side surface, and the spraying part is connected to a multi joint robot.

11. The coating device of claim 1, wherein the ink is sprayed to form a coating layer having a uniform thickness of about 1 μm to about 5 μm.

12. The coating device of claim 1, wherein a contacting portion is disposed on the boundary of the lower surface of the upper stage or on boundary of the upper surface of the lower stage on which the protrusion is not disposed.

13. A coating device comprising:
an upper stage covering an entire upper surface of a display panel;
a lower stage covering an entire lower surface of the display panel; and
a spraying part spraying ink to a side surface of the display panel, the side surface being exposed between the upper stage and the lower stage,
wherein the upper stage comprises a lower surface having a shape substantially the same as that of an upper surface of the display panel, and the lower stage comprises an upper surface having a shape substantially the same as that of a lower surface of the display panel, and
wherein the upper stage further comprises an upper contacting portion disposed on a boundary of the lower surface of the upper stage, and the upper contacting portion is configured to contact to a boundary of the upper surface of the display panel.

14. The coating device of claim 13, wherein the ink has tolerance for isopropyl alcohol.

15. The coating device of claim 13, wherein a nozzle of the spraying part is spaced apart from the side surface of the display panel, the nozzle is perpendicular to the side surface, and the spraying part is connected to a multi joint robot.

16. The coating device of claim 13, wherein the ink is sprayed to form a coating layer having a uniform thickness of about 1 μm to about 5 μm.

17. The coating device of claim 13, wherein the lower stage comprises a protrusion disposed on a boundary of the upper surface of the lower stage.

18. The coating device of claim 17, wherein a first groove is formed on the protrusion, a plurality of air holes for forming an air wall are formed in the first groove, and the air holes are connected to an air supplying part configured for supplying pressurized air.

19. The coating device of claim 18, wherein the lower stage further comprises a lower contacting portion disposed on the protrusion, and the lower contacting portion is configured to contact to a boundary of the lower surface of the display panel.

20. The coating device of claim 17, wherein the protrusion is disposed to be spaced apart from the side surface of the display panel by a first length toward an inside of the display panel, so that a boundary of the lower surface of the display panel will be exposed when the display panel is sandwiched between the upper and lower stages.

* * * * *